(12) United States Patent
You et al.

(10) Patent No.: US 12,528,362 B2
(45) Date of Patent: Jan. 20, 2026

(54) POWER MODULE FOR VEHICLE AND MOTOR DRIVING APPARATUS INCLUDING THE SAME

(71) Applicants: Hyundai Motor Company, Seoul (KR); Kia Corporation, Seoul (KR)

(72) Inventors: Myung Ill You, Seoul (KR); Hyun Koo Lee, Seoul (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 18/902,567

(22) Filed: Sep. 30, 2024

(65) Prior Publication Data

US 2025/0065728 A1    Feb. 27, 2025

Related U.S. Application Data

(63) Continuation of application No. 18/134,464, filed on Apr. 13, 2023, now Pat. No. 12,122,244.

(30) Foreign Application Priority Data

Oct. 18, 2022    (KR) .................. 10-2022-0134237

(51) Int. Cl.
  *B60L 15/00* (2006.01)
  *H01L 23/495* (2006.01)
  *H02M 3/00* (2006.01)
  *H05K 7/10* (2006.01)

(52) U.S. Cl.
  CPC ...... *B60L 15/007* (2013.01); *H01L 23/49541* (2013.01); *H01L 23/49575* (2013.01); *H02M 3/003* (2021.05); *H05K 7/1015* (2013.01)

(58) Field of Classification Search
  CPC ........ B60L 15/00; B60L 15/007; H02M 3/00; H02M 3/003; H01L 23/495; H01L 23/49541; H01L 23/49575; H05K 7/10; H05K 7/1015
  See application file for complete search history.

(56) References Cited

U.S. PATENT DOCUMENTS

| | | |
|---|---|---|
| 2018/0026009 A1 | 1/2018 | Fujita et al. |
| 2019/0238062 A1 | 8/2019 | Lu et al. |
| 2020/0266727 A1 | 8/2020 | Tsuchimochi et al. |
| 2020/0395344 A1 | 12/2020 | Horie |
| 2021/0210472 A1 | 7/2021 | Ji et al. |

FOREIGN PATENT DOCUMENTS

| | | |
|---|---|---|
| JP | 2017-041989 | 2/2017 |
| KR | 10-2017-0092750 | 8/2017 |

*Primary Examiner* — Robert L Deberadinis
(74) *Attorney, Agent, or Firm* — MORGAN, LEWIS & BOCKIUS LLP (57) ABSTRACT

A power module for a vehicle includes: a circuit board provided with a first metallic layer; a first switching portion disposed on a center portion of the circuit board, and including a plurality of semiconductor chips; a second switching portion disposed on the outside the first switching portion on the circuit board and including a plurality of semiconductor chips; a third switching portion disposed on the outside the first switching portion on the circuit board; a lead frame disposed on one side of the circuit board; and a signal lead disposed on the other side of the circuit board.

16 Claims, 5 Drawing Sheets

POWER MODULE FOR VEHICLE AND MOTOR DRIVING APPARATUS INCLUDING THE SAME

CROSS REFERENCE TO RELATED APPLICATION

The present application is a continuation of U.S. patent application Ser. No. 18/134,464, filed Apr. 13, 2023, which claims priority to Korean Patent Application No. 10-2022-0134237, filed Oct. 18, 2022, the entire contents of which is incorporated herein for all purposes by this reference.

BACKGROUND OF THE PRESENT DISCLOSURE

Field of the Present Disclosure

The present disclosure relates to a power module for a vehicle and a motor driving apparatus including the same, and more particularly to a power module for a vehicle designed to reduce the parasitic inductance therein and a motor driving apparatus provided with a plurality of power modules.

Description of Related Art

A power module is a device used for converting DC power to AC power when driving a motor of a hybrid electric vehicle and an electric vehicle.

Conventionally, the power module may include a substrate, a semiconductor chip, which is a switching element adhered to the substrate, power lead applying the power to the semiconductor chip, and a signal lead providing a control signal to the semiconductor chip.

The power module, a switching element, repeats the on-and-off operation. There is a problem in that an overshooting voltage is generated during on-and-off operation due to the internal parasitic inductance caused by the power lead in the power module.

The overshooting voltage may increase power loss and noise of the entire system to which the power module is applied, and in severe cases, there may be a loss in the semiconductor chip.

Because the internal parasitic inductance of the power module also increases as the current path in the power module becomes longer, it is important to reduce the current path in the power module to reduce the parasitic inductance. The length of the lower lead connected to the semiconductor chip inside the power module also affects the current path significantly.

However, due to the structural characteristics of the power module, there is a limit to reduce the length of the power lead located inside the power module, and a new power module structure capable of reducing parasitic inductance inside the power module is required even when the length of the power lead itself is maintained.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing, by arranging semiconductor components with the same potential difference in the power module adjacent to each other, the insulation distance other than the required insulation distance of the signal lead is eliminated, providing a power module with a minimized size of the circuit board, and driving apparatus of a vehicle motor formed by combining a plurality of power modules designed as described above.

A power module for a vehicle according to an exemplary embodiment of the present disclosure includes: a circuit board provided with a first metallic layer; a first switching portion disposed on a center portion of the circuit board, and including a plurality of semiconductor chips; a second switching portion disposed on an outside the first switching portion on the circuit board and including the plurality of semiconductor chips; a third switching portion disposed on the outside the first switching portion on the circuit board; a lead frame disposed on one side of the circuit board; and a signal lead disposed on the other side of the circuit board.

The second switching portion may include a 2-1st switching element disposed on one side along a first direction and a 2-2nd switching element disposed on the other side opposite to the one side thereof in the first direction.

The lead frame may include a plurality of bus bars disposed in an order of N-P-N or P-N-P along the first direction.

In N-P-N or P-N-P, a central bus bar may be adjacent to the first switching portion.

At least a portion of a P bus bar may overlap the first switching portion in a second direction intersecting the first direction thereof.

The third switching portion may be disposed adjacent to the 2-1st switching element.

The first switching portion may include a 1-1st switching element disposed on one side and spaced from each other in a second direction intersecting the first direction and a 1-2nd switching element disposed on the other side opposite to the one side thereof.

The circuit board may further include a current measuring portion configured for measuring a current of the circuit board disposed adjacent to the 1-1st switching element.

The first switching portion and the third switching portion are configured in a SiC chip, and the second switching portion may be configured in a Si chip.

The first switching portion always operates, and the second switching element may operate with the first switching element according to the third switching portion.

A motor driving apparatus according to an exemplary embodiment of the present disclosure includes three vehicle power modules, and in each of the vehicle power modules, the first switching portion includes a 1-1st switching element and a 1-2nd switching element, and corresponding to one leg a first inverter, the second switching includes a 2-1st switching element and a 2-2nd switching element, and corresponds to one leg of a second inverter, and one end portion of the third switching portion is connected between a first node between the 1-1st switching element and the 1-2nd switching element and a second node between the 2-1st switching element and the 2-2 switching element, and may form a portion of a transfer switch.

Each of the power modules includes a plurality of lead frames, and lead frames connected to the third switching portion among the plurality of lead frames may electrically connected to each other outside the power module.

A power module for a vehicle according to an exemplary embodiment of the present disclosure can minimize the size of the circuit board by removing insulation distance other than the required insulation distance of the signal leads by arranging semiconductor parts with the same potential difference in the power module adjacent to each other.

Furthermore, inductance generated in the circuit may be reduced by connecting a lead frame disposed adjacent to a plurality of electrodes connected to the semiconductor chip to one side of the circuit board.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRA WINGS

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Specific structural or functional descriptions in the exemplary embodiments of the present disclosure included in the specification or application are merely for detailed description of the present disclosure, may be embodied in various forms and should not be construed as limited to the exemplary embodiments described in the specification or application.

Specific exemplary embodiments are illustrated in the drawings and described in detail in the specification or application because the exemplary embodiments of the present disclosure may have various forms and modifications. It should be understood, however, that there is no intent to limit the exemplary embodiments of the present disclosure to the specific embodiments, but the intention is to cover all modifications, equivalents, and alternatives included to the scope of the present disclosure.

Terms used in the specification, "first", "second", etc. may be used to describe various components, but the components are not to be construed as being limited to the terms. The terms are only used to differentiate one component from other components. For example, the "first" component may be named the "second" component without departing from the scope of the present disclosure, and the "second" component may also be similarly named the "first" component.

It will be understood that when a component is referred to as being "connected to" or "coupled to" another component, it may be directly connected to or coupled to another component or intervening components may be present. In contrast, when a component is referred to as being "directly connected to" or "directly coupled to" another component, there are no intervening components present. Other words used to describe the relationship between elements should be interpreted in a like fashion (e.g., "between" versus "directly between," "adjacent" versus "directly adjacent," etc.).

The terminology used herein is for describing particular example embodiments only and is not intended to be limiting of the present inventive concept. As used herein, the singular form is directed to include the plural forms as well, unless context clearly indicates otherwise. In the present application, it will be further understood that the terms "comprises," "includes," etc. specify the presence of stated features, integers, steps, operations, elements, components, or combinations thereof, but do not preclude the presence or addition of one or more other features, integers, steps, operations, elements, components, or combinations thereof.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning which is consistent with their meaning in the context of the relevant art and will not be interpreted in an idealized or overly formal sense unless expressly so defined herein.

Hereinafter, various exemplary embodiments will be described in detail with reference to the accompanying drawings. Like reference numerals refer to the like elements throughout.

Figure 1:
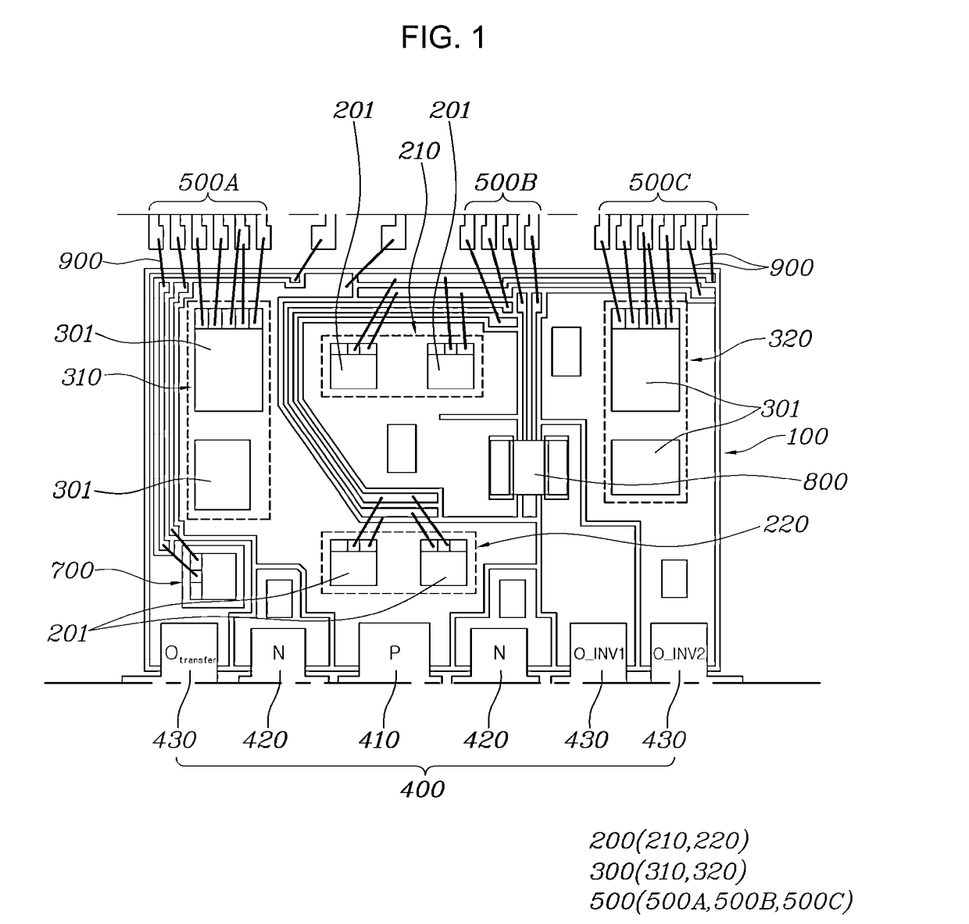
FIG. 1 is a plan view of a power module for a vehicle according to an exemplary embodiment of the present disclosure.
Figure 2:
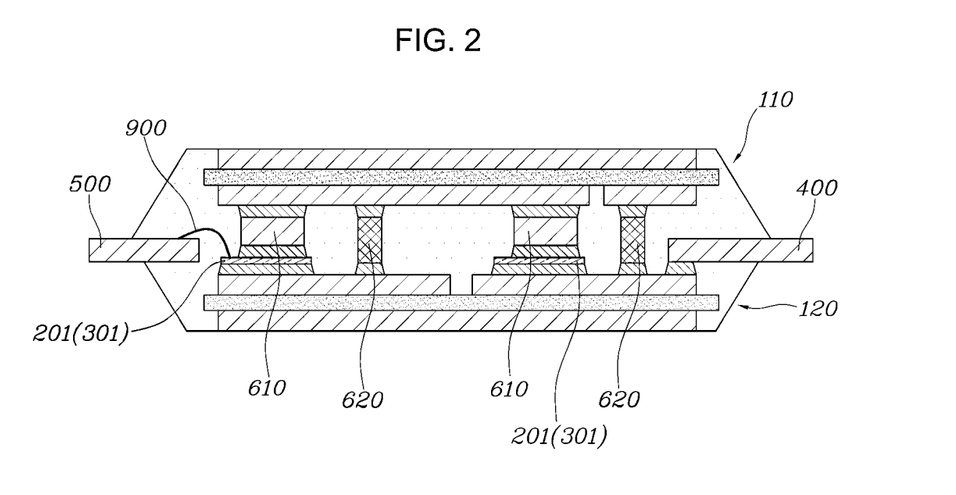
FIG. 2 is a cross-sectional side view of a power module for a vehicle according to an exemplary embodiment of the present disclosure.
Figure 3:
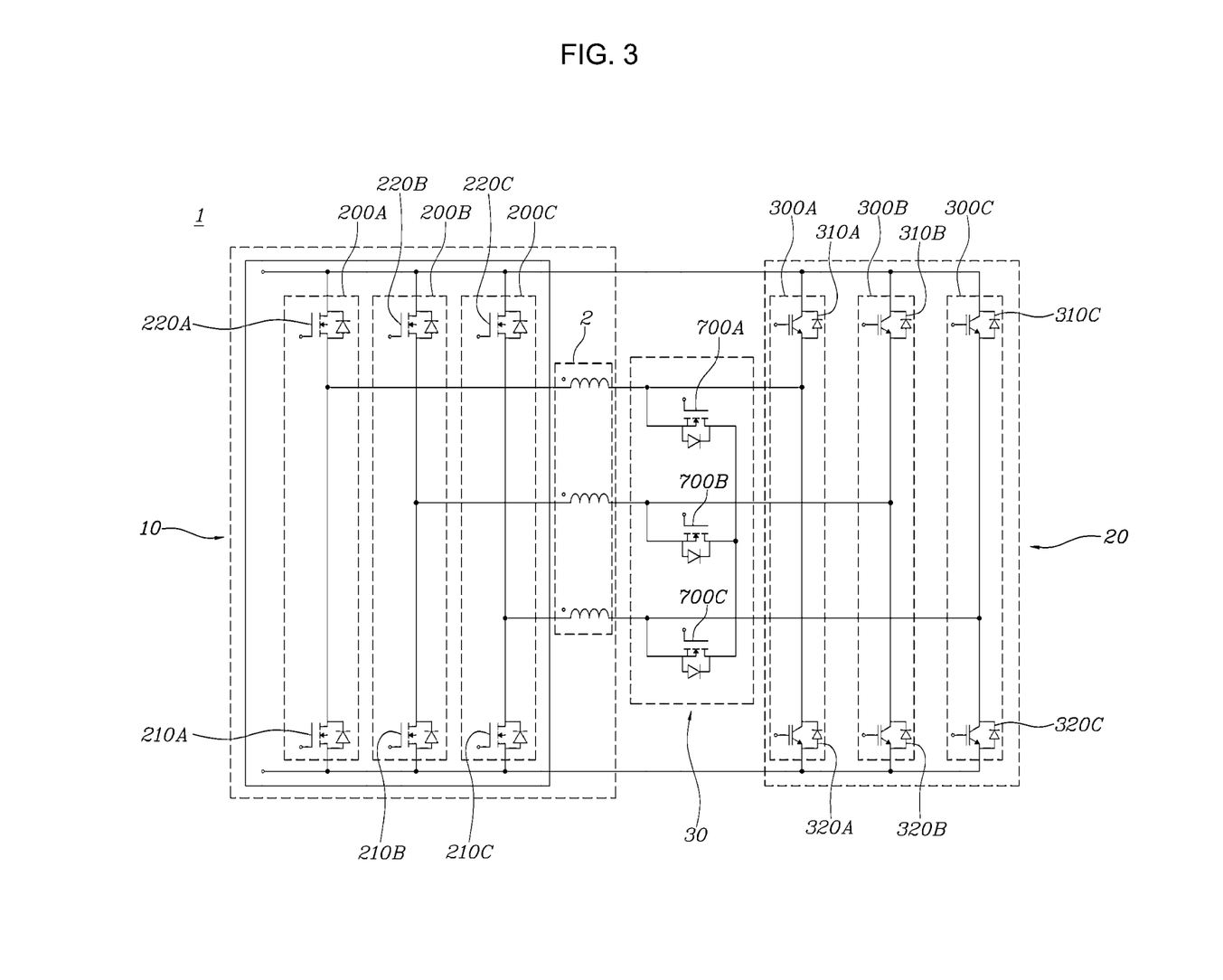
FIG. 3 is a circuit diagram of a power module for a vehicle according to an exemplary embodiment of the present disclosure.
Figure 4:
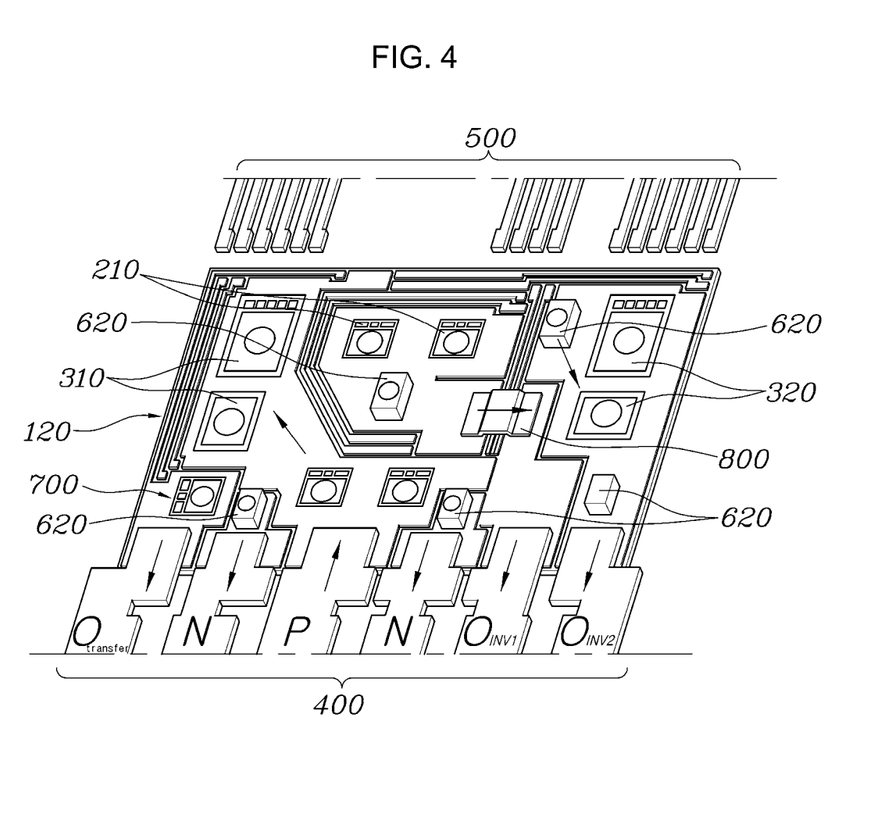
FIG. 4 is a view showing a current flow of a lower substrate according to an exemplary embodiment of the present disclosure.
Figure 5:
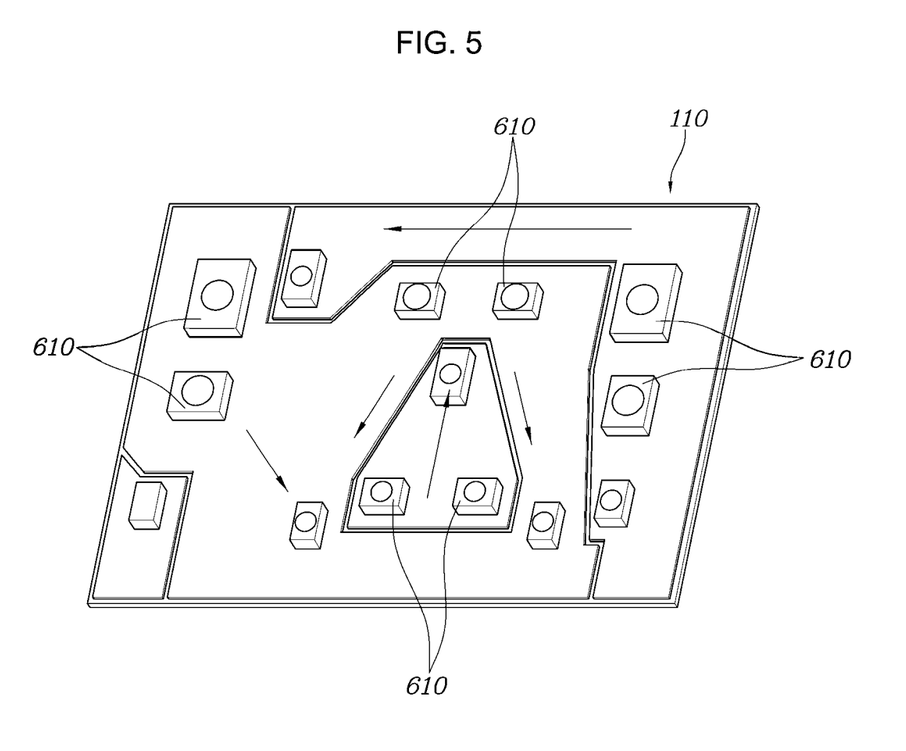
FIG. 5 is a view showing a current flow of an upper substrate according to an exemplary embodiment of the present disclosure.

FIG. 1 is a plan view of a power module for a vehicle according to an exemplary embodiment of the present disclosure; FIG. 2 is a cross-sectional side view of a power module for a vehicle according to an exemplary embodiment of the present disclosure; FIG. 3 is a circuit diagram of a power module for a vehicle according to an exemplary embodiment of the present disclosure; FIG. 4 is a view showing a current flow of a lower substrate according to an exemplary embodiment of the present disclosure; and FIG. 5 is a view showing a current flow of an upper substrate according to an exemplary embodiment of the present disclosure.

The motor driving apparatus for the vehicle may operate the motor by receiving DC current from a high-voltage battery provided in the electric vehicle, converting the input DC current into an AC current, and outputting the DC current to the motor.

The motor driving apparatus may be provided with an inverter including a plurality of switching elements, and two inverters may be provided to efficiently operate the motor.

A first inverter among the two inverters may always be operated, and when a motor requires high output power, a second inverter may be operated together with the first inverter. When the first inverter and the second inverter are connected, and when only the first inverter is operated, a transfer switch may be provided which is turned on to provide a Y-connection between each phase winding of the motor and is turned off when the second inverter is also operated.

To operate the three-phase motor in the above-described motor driving apparatus, each of the first inverter and the second inverter is provided with six switching elements, the switching element is divided into a top element and a bottom element connected in series with each other form one leg, a top element and a bottom element connected in series with each other form one leg, and each of these three legs may be connected to a motor to operate the motor.

The motor driving apparatus may be configured through a combination of a plurality of power modules including one or more switching elements, and each power module is significantly affected by the number of switching elements included therein, and the number of signal leads and bus bars according to the number of switching elements. That is, as the number of switching elements mounted on a single power module increase, and as the number of switching elements having different roles increases, the number of signal leads and bus bars significantly increases. Furthermore, the switching element is implemented as an insulated gate bipolar transistor (IGBT) or a metal oxide semiconductor field effect transistor (MOSFET), and in the specification of power module for an electric vehicle, a signal with a potential difference of about 15 V based on a source emitter is normally applied as a signal lead for operation control. An insulation distance is not required between signal leads having the same potential with respect to the source or an emitter, but the minimum insulation distance (e.g., about 4 mm) has to be satisfied between signal leads with a potential difference. Consequently, the size of the power module is inevitably affected by the insulation distance between signal leads.

In various aspects of the present disclosure, the present disclosure is provided to minimize the size of a module by disposing a switching element of a first inverter, a switching element of a second inverter, and a switching element of a transfer switch on one circuit board to minimize the insulation distance of a signal lead.

Hereinafter, a preferable embodiment of a power module for a vehicle according to an exemplary embodiment of the present disclosure will be described with reference to FIG. 1, FIG. 2, FIG. 3, FIG. 4, and FIG. 5.

A power module for a vehicle according to an exemplary embodiment of the present disclosure includes: a circuit board 100 provided with a first metallic layer; a first switching portion 200 disposed on a center portion of the circuit board 100, and including a plurality of semiconductor chips 201 and 301; a second switching portion 300 disposed on the outside the first switching portion 200 on the circuit board and including the plurality of semiconductor chips 201 and 301; a third switching portion 700 disposed on the outside the first switching portion 200 on the circuit board; a lead frame 400 disposed on one side of the circuit board 100; and a signal lead 500 disposed on the other side of the circuit board 100.

As illustrated in FIG. 1, the first switching portion 200 including a plurality of semiconductor chips, the center portion of the circuit board 100 may be disposed in the center portion of the circuit board 100, and the second switching portion 300 including a plurality of semiconductor chips 301 may be disposed outside the first switching portion 200 located in the center portion of the circuit board 100.

The first switching portion 200 configures a motor driving apparatus as illustrated in FIG. 3 and is always operated when a motor 2 is driven to input current to the motor 2, and the second switching portion 300 may input and output current together with the first switching portion 200 in a state in which the third switching portion 700 is turned off when the motor 2 operates in the high output mode.

Furthermore, one side of the circuit board 100, the semiconductor chip 201 of the first switching portion 200, the semiconductor chip 301 of the second switching portion 300, and the third switching portion 700 may be electrically connected to each other, and on the other side of the circuit board 100, a lead frame 400 which is operated by a change current and input or output from the outside thereof may be disposed.

As illustrated in FIG. 2, the circuit board 100 may further include an upper substrate 110 and a lower substrate 120 spaced from each other in the vertical direction, first switching portion 200, a second switching portion 300, and a third switching portion 700 are connected on any one of the upper substrate 110 or on the lower substrate 120, and a spacer 610 connecting the first switching portion 200, the second switching portion 300, and the third switching portion 700 to the other substrate.

For example, the circuit board 100 may include the lower substrate 120 and the upper substrate 110 spaced in the vertical direction, in an exemplary embodiment of the present disclosure, the semiconductor chip 201 of the first switching portion 200 and the semiconductor chip 301 of the second switching portion 300 may be provided with power terminals for inputting and outputting current for power conversion, the power terminal formed on the lower surface may be connected on the lower substrate 120, and the power terminal formed on the upper surface may be connected on the upper substrate 110.

One side of each of the semiconductor chips 201 and 301 is connected to one of the lower substrate 120 or the upper substrate 110, the spacer 610 connecting the other side to the other non-connected substrate is provided so that the current of the circuit board 100 may flow.

The lower substrate 120 may be a substrate including an insulating layer and a metallic layer bonded to upper and lower surfaces of the insulating layer, respectively. In the art, the substrate is referred to as a double bonded copper (DBC) substrate. The first metallic layer of the lower substrate 120 may have a pattern for forming an electrical connection, and the lower surfaces of the semiconductor chips 201 and 301 may be bonded to form electrical contact with one power terminal of the semiconductor chips 201 and 301.

Although not illustrated, a cooling channel for cooling the power module may be in contact with the lower surface of the second metallic layer of the lower substrate 120.

The upper substrate 110 may also employ a substrate including an insulating layer and a metallic layer bonded to the upper and lower surfaces of the insulating layer, respectively. The first metallic layer of the upper substrate 110 may be bonded to the upper surfaces of the semiconductor chips 201 and 301 through the spacer 610 to form an electrical connection with other power terminals of the semiconductor chips 201 and 301.

Similar to the second metallic layer of the lower substrate 120 a cooling channel for cooling the power module may contact with an upper surface of the second metallic layer of the upper substrate 110.

The first metallic layer of the upper substrate 110 may form an electrical connection with the first metallic layer of the lower surface 120 through a via spacer 620. Of course, one region of the first metallic layer electrically connected to the power terminals formed on the lower surfaces of the semiconductor chips 201 and 301 and one region of the first metallic layer electrically connected to the first metallic layer of the upper substrate 110 through the via spacer 620 are electrically insulated to each other to form a pattern of the first metallic layer.

The lead frame 400 is electrically joined to the region of the first metallic layer connected to the lower power terminals of the semiconductor chips 201 and 301 and the region connected to the upper power terminals of the semiconductor chips 201 and 301 through the via spacer 620.

The lead frame 400 may include an N-type electrode 410, a P-type electrode 420, and an output electrode 430.

As shown in FIG. 1, the lead frame 400 connected to the circuit board 100 may include a plurality of electrodes, such as a positive (P) electrode 410 to which a DC current is input, a negative (N) electrode 420, and an output (O) electrode 430 to which an AC current is output.

The negative electrode 420 and the positive electrode 410 are connected to a battery, and the output electrode 430 may be connected to the motor 2.

Three output electrode 430 may be provided to correspond to the first switching portion, the second switching portion, and the third switching portion.

Furthermore, as illustrated in FIG. 1, by disposing the negative electrode 410 on both sides of the positive electrode 420, so that the inductance of the circuit may be reduced.

Furthermore, the plurality of semiconductor chips 201 included in the first switching portion 200 include a 1-1st switching element 210 and a 1-2nd switching element 220 connected to the motor 2 of the vehicle, and the plurality of semiconductor chips 301 included in the second switching portion 300 may include a 2-1st switching element 310 and a 2-2nd switching element 320 connected to the motor 2 of the vehicle.

As illustrated in FIG. 1, the 1-1st switching element 210 and the 1-2 switching element 220 of the first switching portion 200 may be disposed to be vertically spaced from the center portion of the circuit board 100, and the 2-1st switching element 310 and the 2-2nd switching element 320 of the second switching portion 300 may be disposed outside the first switching portion 200 from each other. That is, the second switching portion 300 may include a 2-1st switching element 310 disposed on one side along the first direction and a 2-2nd switching element 320 disposed on the other side opposite to the one side thereof.

The 1-2nd switching element 220 of the first switching portion 200 and the 22nd switching element 320 of the second switching portion 300 may be formed with a same potential difference, and by arranging the 1-2nd switching element 220 of the first switching portion 200 and the 2-2nd switching element 320 of the second switching portion 300 adjacent to each other, an insulation distance other than a necessary insulation distance of the signal lead 500 may be removed to reduce the size of the circuit board 100.

The third switching portion 700 may be disposed adjacent to the 2-1st switching element 310 of the second switching portion 300.

The third switching portion 700 may be formed to have the same potential difference as the 2-1st switching element 310 of the second switching portion 300, and as the 2-1st switching element 310 of the third switching portion 700 and the second switching portion 300 are disposed adjacent to each other, an insulation distance other than the required insulation distance of the signal lead 500 may be removed to reduce the size of the circuit board 100.

The circuit board 100 may further include a current measuring portion 800 disposed adjacent to the 1-1st switching element 210 of the first switching portion 200 and measuring the current of the circuit board 100.

The current measuring portion 800 may be connected to the circuit board 100 to measure the current flowing in the circuit, the current measuring portion 800 is generally formed by a shunt resistor to determine how much current flows through a specific part of the circuit or a specific part of the equipment, and it is possible to measure the current in the circuit without providing an ammeter separately outside, reducing the cost.

As shown in FIG. 1, because the current measuring portion 800 has the same potential difference as the 1-2nd switching element 220 of the first switching portion 200, by disposing the signal lead at a position adjacent to the 1-2nd switching element 220 of the first switching portion 200, there is an effect of reducing the size of the circuit board 100 by removing the insulation distance other than the required insulation distance of the signal lead 500.

The current measuring portion 800 may include a wire 900 connecting the signal lead 500 to the first switching portion 200 and the second switching portion 300 connected to the circuit board 100.

As shown in FIGS. 1 to 2, the first switching portion 200, the second switching portion 300, and the third switching portion 700 coupled to the circuit board 100 have to be connected to the signal lead 500 to receive a control signal from the outside thereof, and the wire 900 may connect the signal lead 500, the first switching portion 200, the second switching portion 300, and the third switching portion 700.

A plurality of signal leads 500 are disposed on one side of the circuit board 100, and by allowing the wire 900 connects the semiconductor chip 210 and 301 of the first switching unit 200 and the second switching unit 300 to be disposed on the circuit board 100 based on the insulation distance to the signal lead 500, the size of the circuit board 100 may be reduced significantly.

The lead frame 400 includes a plurality of bus bars disposed in an order of N-P-N or P-N-P along the first direction.

The N bus bar and the P bus bar are DC terminal, and the N bus bar is a negative DC terminal, and the P bus bar is a positive DC terminal. Furthermore, the O bus bar included in the lead frame is an AC output terminal.

In N-P-N or P-N-P, the central bus bar may be disposed to be adjacent to the first switching portion 200.

At least a portion of the P bus bar may overlap the first switching portion 200 in a second direction intersecting the first direction thereof.

Hereinafter, a preferable embodiment of a motor driving apparatus 1 according to an exemplary embodiment of the present disclosure will be described with reference to FIG. 1, FIG. 2, and FIG. 3.

A motor driving apparatus 1 according to an exemplary embodiment of the present disclosure includes three vehicle power modules, and in each of the vehicle power modules, the first switching portion 200 includes a 1-1st switching element 210 and a 1-2nd switching element 220, and one of the first inverters 10 corresponding to the leg, the second switching includes a 2-1st switching element 310 and a 2-2nd switching element 320, and corresponds to one leg of a second inverter 20, and one end portion of the third switching portion 400 is connected between the first node between the 1-1st switching element 210 and the 1-2nd switching element 220 and the second node between the 2-1st switching element 310 and the 2-2nd switching element 320, and may form a portion of the transfer switch.

As shown in FIG. 3, the motor driving apparatus 1 according to an exemplary embodiment of the present disclosure includes a first inverter 10 and a second inverter 20, and may configured as a transfer switch 30 connected to the second inverter 20 to control the operation of the second inverter 20.

The first inverter 10 is connected to the motor 2 and is always operated, and the transfer switch 30 is operated to connect the second inverter 20 and the motor 2, and the transfer switch 30 is operated when the driver of the vehicle is configured to control the motor 2 to operate with high performance, and operates the motor 2 so that the first inverter 10 and the second inverter 20 simultaneously connected to the motor 2 may be configured to generate high output.

At the present time, the first inverter 10 of the motor drive device 1 is configured with a first inverter 10 provided with the 1-1st switching element 210 and three first switching portions 200 (200A, 200B, and 200C) including the 1-2nd switching element 220 to form the first inverter 10, a second inverter 20 may be provided with the 21st switching element 310 and the 2-2nd switching element 320 and three second switching portions 300 (300A, 300B, and 300C) including the 2-2nd switching element 320 to form the second inverter 20, and the transfer switch 30 may be formed by having three third switching portions 700.

The vehicle power module illustrated in FIG. 1 includes one first switching portion 200, one second switching portion 300, and one third switching portion 700, the motor driving apparatus 1 according to an exemplary embodiment of the present disclosure may be implemented by combining the three power modules for a vehicle, and by arranging and designing the switching element to minimize the insulation distance of the signal lead 500 of the vehicle power module, the motor driving apparatus 1 according to an exemplary embodiment of the present disclosure may minimize the size compared to the conventional motor driving apparatus 1.

Each of the power modules for the vehicle includes a plurality of lead frames 400, and lead frames 400 connected to the third switching portion 700 among the plurality of lead frames 400 may electrically connected to each other outside the power module.

As shown in FIG. 3, one end portion of the third switching portion 700 is connected between the motor 2 and the second switching portion 300, when the other end portion thereof is connected to the lead frame 400 and is turned on by being connected to each other outside the power module, the Y-connection for each winding of the motor 2 may be provided.

Based on the configuration of the motor driving device in FIG. 3, grouping between the signal leads 500 of the power module in accordance with an exemplary embodiment of the present disclosure will be described in more detail below.

As described above, when the three power modules shown in FIG. 1 are combined, the motor driving apparatus shown in FIG. 3 may be configured. For example, it is assumed that the power module illustrated in FIG. 1 corresponds to one leg 200A of the first switching portion 200 of the first inverter 10, one leg 300A of the second switching portion 300 of the second inverter 20, and the first switch 700A of the transfer switch 30.

In the leg 200A of the first switching portion 200, a top switch 220A corresponds to the 1-2nd switching element 220 in FIG. 1, and a bottom switch 210A corresponds to the 1-1st switching element in FIG. 1. Furthermore, in the leg 300A of the second switching portion 300, a top switch 310A corresponds to the 2-1st switching element 310 in FIG. 1, and a bottom switch 320A corresponds to the 2-2nd switching element in FIG. 1.

Under the present correspondence, when looking at the potential difference from the perspective of the motor driving apparatus, the top switch 310A and the first switch 700A of the transfer switch 30 have the same potential in the leg 300A of the second switching portion 300. Thus, as shown in FIG. 1, the signal lead 500A for the 21st switching element 310 and the third switching element 700 may be disposed adjacent to each other because there is no demand for an insulation distance therebetween.

The potential difference between the top switch 220A and the shunt (800 in FIG. 1, disposed between the leg 200A and one coil of the motor 2 in FIG. 3) in the leg 200A of the fast switching portion 200 is the same. Accordingly, as shown in FIG. 1, the 1-2nd switching element 220 and the signal lead 500B for the shunt 800 may be disposed adjacent to each other because an insulation distance therebetween is not required.

Furthermore, the bottom switch 210A in the leg 200A of the first switching portion 200 and the bottom switch 320A in the leg 300A of the second switching portion 300 have the same potential. Accordingly, As shown in FIG. 1, the signaling leads 500C of the 1-1st switching element 210 and the 2-2nd switching element 320 may be disposed to be adjacent to each other because an insulation distance is not required.

Consequently, signal leads with a potential difference should be spaced apart to secure mutual insulation distance (e.g., between 500A and 500B, between 500B and 500C, etc.), and by grouping the signal leads at the same potential and arranging the signal leads adjacent to each other, the size of the power module (i.e., the horizontal direction in FIG. 1) may be reduced.

The grouping between the signal leads 500 determines the relative arrangement position between the chips on the power module substrate as shown in FIG. 1, so that it is easy to secure an electrical path between each chip and the wiring point for the signal lead 500.

A current flow will be described below with reference to FIG. 4 and FIG. 5. FIG. 4 is substantially the same as the power module shown in FIG. 1, while FIG. 4 shows the shape of the upper surface of the lower substrate 120 with respect to FIG. 2, and FIG. 5 illustrates an upper surface shape of the lower substrate 120 and a lower surface shape of the upper substrate 110 facing each other. Accordingly, when the upper substrate 110 of FIG. 5 is flipped in the left and right directions and disposed on the lower substrate 120, the structure of FIG. 2 is formed.

Similar to the description of FIG. 3 in FIG. 4 and FIG. 5, it is assumed that the power module illustrated in FIG. 4 corresponds to one leg 200A of the first switching portion 200 of the first inverter 10, one leg 300A of the second switching portion 300 of the second inverter 20, and the first switch 700A of the transfer switch 30.

Referring to FIG. 1, FIG. 2, FIG. 3, FIG. 4, and FIG. 5, a current input to a P bus bar of the lower substrate 120 heads to the top phase switching elements 220 and 310 among one leg of each of the first Inverter 10 and the second inverter 20. The current passing through the top phase element 220 of the first inverter 10 passes through the central spacer 610 and the via spacer 620 connected through the upper substrate 110 and then comes down to the lower substrate 120. In the upper center portion of the lower substrate 120, the current path may be connected to the bottom phase element 210 of the first inverter 10, or may be connected to the O bus bar OiNvi through the shunt 800. The bottom phase element 210 may be connected to the upper substrate 110 again through a spacer 610 thereon, and the current path of the upper substrate 110 is connected to the lower substrate 120 through the lower via spacer 620 and is connected to the N bus bars on both sides of the P bus bar. In the case of the second inverter 20 as well, it is connected to the transfer switch 30 after the top phase element 310 through the element 700 through the transfer O bus bar$_{(Otransfer)}$, or may be connected to the upper substrate 110 by the spacer 610 on the upper portion of the top phase element 310, and may be connected to the bottom phase element 320 and the O-bus bar OINV2 through the via spacer 620 on the upper right side of the lower substrate 120. The bottom phase element 320 may be connected to the upper substrate 110 again through a spacer 610 thereon, and the current path of the upper substrate 110 is connected to the lower substrate 120 through the lower via spacer 620 and is connected to the N bus bars on both sides of the P bus bar.

The first switching portion 200 and the third switching portion 700 are configured in a SiC chip, and the second switching portion 300 may be configured in a Si chip. In the instant case, when only the first inverter 10 is operated for driving the motor, the transfer switch 30 is turned on, and in the instant case, as the pulse width modulation control needs to be performed only with the first switching portion 200 together with the operation of the third switching portion 700, the corresponding switching portions 200 and 700 should be configured with relatively high performance.

In contrast, although the second switching portion 300 is activated together with the first switching portion 200 in a situation in which a high output is required, the switching speed and frequency of use are relatively low, so that the second switching portion 300 may be configured with relatively low performance.

Accordingly, the first switching portion 200 may be configured as a SiC chip having low thermal resistance under a high-speed switching situation, and the second switching portion 300 may be configured as a Si chip including lower performance than the first switching portion 200.

The semiconductor type of each of the above-described switching devices is according to an exemplary embodiment of the present disclosure, and is not necessarily limited thereto, and various types of semiconductors may be applied.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module for a vehicle, the power module comprising:
   a circuit board provided with a first metallic layer;
   a first switching portion disposed on a center portion of the circuit board, and including a plurality of semiconductor chips;
   a second switching portion disposed on an outside the first switching portion on the circuit board and including the plurality of semiconductor chips; and
   a third switching portion disposed on the outside the first switching portion on the circuit board.

2. The power module of claim 1, further comprising:
   a lead frame disposed on the circuit board; and
   a signal lead disposed on the circuit board.

3. The power module of claim 2, wherein:
   the lead frame is disposed on a first portion of the circuit board; and
   the signal lead is disposed on a second portion of the circuit board.

4. The power module of claim 3, wherein the second switching portion includes a 2-1st switching element disposed on one side along a first direction and a 2-2nd switching element disposed on the other side opposite to the one side thereof in the first direction.

5. The power module of claim 4, wherein the lead frame includes a plurality of bus bars disposed in an order of N-P-N or P-N-P along the first direction.

6. The power module of claim 5,
   wherein at least a portion of a P bus bar overlaps the first switching portion in a second direction intersecting the first direction thereof.

7. The power module of claim 4, wherein in the order of N-P-N or P-N-P, a central bus bar is adjacent to the first switching portion.

8. The power module of claim 4, wherein the third switching portion is disposed to be adjacent to the 2-1st switching element.

9. The power module of claim 1,
   wherein the first switching portion includes a 1-1st switching element disposed on one side in a second direction intersecting the first direction and a 1-2nd switching element disposed on the other side opposite to the one side thereof in the second direction.

10. The power module of claim 9, wherein the circuit board further includes a current measuring portion configured for measuring a current of the circuit board disposed adjacent to the 1-1st switching element.

11. The power module of claim 1, wherein the first switching portion and the third switching portion are configured in a SiC chip, and the second switching portion is configured in a Si chip.

12. The power module of claim 1, wherein the first switching portion always operates, and the second switching portion operates with the first switching portion in response to the third switching portion.

13. A motor driving apparatus comprising:
- three vehicle power modules of the power module for the vehicle of claim 1,
- wherein each of the vehicle power modules includes:
- the first switching portion including a 1-1st switching element and a 1-2nd switching element, and corresponding to one leg of a first inverter; and
- the second switching including a 2-1st switching element and a 2-2nd switching element, and corresponding to one leg of a second inverter,
- wherein one end of the third switching portion is connected between a first node between the 1-1st switching element and the 1-2nd switching element and a second node between the 2-1st switching element and the 2-2 switching element, and forms a portion of a transfer switch.

14. The apparatus of claim 13, wherein each of the vehicle power modules further includes a plurality of lead frames, and the lead frames connected to the third switching portion among the plurality of lead frames are electrically connected to each other outside the power module.

15. The apparatus of claim 13, wherein each of the vehicle power modules further includes a plurality of signal leads, and
- wherein the signal leads including a same potential in the motor driving apparatus are arranged adjacent to each other in each vehicle power module.

16. The apparatus of claim 15, wherein the signal leads including the same potential includes:
- a signal lead corresponding to the transfer switch and the 2-1st switching element; and
- a signal lead corresponding to the 1-1st switching element and the 2-2nd switching element.

* * * * *